United States Patent
Hamazaki et al.

(10) Patent No.: US 11,604,111 B2
(45) Date of Patent: Mar. 14, 2023

(54) PRESSURE SENSOR ENABLING HIGH LINEARITY OF CHANGE IN ELECTROSTATIC CAPACITANCE

(71) Applicant: Murata Manufacturing Co., Ltd., Nagaokakyo (JP)

(72) Inventors: Ryohei Hamazaki, Nagaokakyo (JP); Daiki Tsuji, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 303 days.

(21) Appl. No.: 17/035,805

(22) Filed: Sep. 29, 2020

(65) Prior Publication Data

US 2021/0010887 A1    Jan. 14, 2021

Related U.S. Application Data

(63) Continuation of application No. PCT/JP2019/011861, filed on Mar. 20, 2019.

(30) Foreign Application Priority Data

May 16, 2018    (JP) .............................. JP2018-094921

(51) Int. Cl.
*G01L 9/00*    (2006.01)
(52) U.S. Cl.
CPC .......... *G01L 9/0073* (2013.01); *G01L 9/0042* (2013.01)
(58) Field of Classification Search
None
See application file for complete search history.

(56) References Cited

U.S. PATENT DOCUMENTS

| 9,791,340 B2* | 10/2017 | Bilic | G01L 9/0042 |
| 11,280,692 B2* | 3/2022 | Hamazaki | H01L 29/84 |
| 2005/0252303 A1 | 11/2005 | Taniguchi | |
| 2007/0209443 A1* | 9/2007 | Yoshikawa | G01L 9/0075 |
| | | | 73/718 |
| 2013/0118265 A1* | 5/2013 | Besling | G01L 9/0073 |
| | | | 216/13 |

(Continued)

FOREIGN PATENT DOCUMENTS

| JP | 07-174652 A | 7/1995 |
| JP | 08-271364 A | 10/1996 |
| JP | 2005-326293 A | 11/2005 |

(Continued)

OTHER PUBLICATIONS

Official Communication issued in International Patent Application No. PCT/JP2019/011861, dated Apr. 23, 2019.

*Primary Examiner* — Peter J Macchiarolo
*Assistant Examiner* — Jermaine L Jenkins
(74) *Attorney, Agent, or Firm* — Keating & Bennett, LLP (57) ABSTRACT

A pressure sensor includes a base, a membrane disposed at a distance from the base, a first fixed electrode provided on the base so as to be opposite to the membrane and including a dielectric layer, and a second fixed electrode provided on the base so as to be opposite to the membrane. When pressure that acts on the membrane increases to cause the membrane to sag toward the base, the membrane comes in contact with the dielectric layer of the first fixed electrode before a distance between the membrane and the second fixed electrode becomes constant.

20 Claims, 10 Drawing Sheets

(56) References Cited

U.S. PATENT DOCUMENTS

2014/0338459 A1* 11/2014 Besling ................ G01L 19/148
  73/718

FOREIGN PATENT DOCUMENTS

| JP | 2005-331328 A | 12/2005 |
| JP | 2007-303922 A | 11/2007 |
| JP | 2013-104797 A | 5/2013 |
| KR | 10-1489302 B1 | 2/2015 |

* cited by examiner

PRESSURE SENSOR ENABLING HIGH LINEARITY OF CHANGE IN ELECTROSTATIC CAPACITANCE

CROSS REFERENCE TO RELATED APPLICATIONS

This application claims the benefit of priority to Japanese Patent Application No. 2018-094921 filed on May 16, 2018 and is a Continuation Application of PCT Application No. PCT/JP2019/011861 filed on Mar. 20, 2019. The entire contents of each application are hereby incorporated herein by reference.

BACKGROUND OF THE INVENTION

1. Field of the Invention

The present invention relates to a pressure sensor for measuring pressure, such as atmospheric pressure.

2. Description of the Related Art

In related art, as described, for example, in Japanese Unexamined Patent Application Publication No. 2013-104797, there is a touch mode pressure sensor as a capacitive pressure sensor. Such a touch mode pressure sensor includes a fixed electrode, and a membrane that is disposed at a distance from the fixed electrode and sags under pressure. On the fixed electrode, a dielectric layer opposite to the membrane is provided. First, when pressure acts on the membrane to cause the membrane to sag, a distance between the fixed electrode and the membrane decreases, and electrostatic capacitance between the fixed electrode and the membrane increases. After the membrane comes in contact with the dielectric layer on the fixed electrode, that is, during a touch mode, when the area of contact of the dielectric layer with the membrane increases, the electrostatic capacitance between the fixed electrode and the membrane increases. The touch mode pressure sensor calculates pressure from an electrostatic capacitance value by using such pressure-capacitance characteristics and outputs a calculated result as a pressure measurement value.

In the case of the touch mode pressure sensor described in Japanese Unexamined Patent Application Publication No. 2013-104797, however, in a pressure range from a pressure at which the membrane starts to come in contact with the dielectric layer on the fixed electrode to a predetermined pressure, a change in electrostatic capacitance with respect to a change in pressure differs from that in another pressure range, and the linearity thereof is low. For this reason, a calculation equation for calculating a pressure measurement value from an electrostatic capacitance value becomes complicated, and calculation accuracy is low. As a result, measurement accuracy (pressure calculation accuracy) of the pressure sensor is low.

In particular, in the case of the touch mode pressure sensor described in Japanese Unexamined Patent Application Publication No. 2013-104797, a central portion of the dielectric layer opposite to a central portion of the membrane is recessed with respect to another portion. For this reason, in a first pressure range from a pressure at which the membrane starts to come in contact with a recessed portion of the dielectric layer to a first predetermined pressure and a second pressure range from a pressure at which the membrane starts to come in contact with a non-recessed portion of the dielectric layer to a second predetermined pressure, that is, in two different pressure ranges, the linearity of a change in electrostatic capacitance with respect to a change in pressure is low.

SUMMARY OF THE INVENTION

Preferred embodiments the present invention provide pressure sensors that each enable high linearity of a change in electrostatic capacitance between a fixed electrode and a membrane with respect to a change in pressure that acts on the membrane to be obtained over an entire pressure measuring range and that is thus able to measure pressure with high accuracy.

A pressure sensor according to a preferred embodiment of the present invention includes a base; a membrane disposed at a distance from the base; a first fixed electrode provided on the base so as to be opposite to the membrane and including a dielectric layer; and a second fixed electrode provided on the base so as to be opposite to the membrane.

When pressure that acts on the membrane increases to cause the membrane to sag toward the base, the membrane comes in contact with the dielectric layer of the first fixed electrode before a distance between the membrane and the second fixed electrode becomes constant.

Preferred embodiments of the present invention each provide pressure sensor that each enable high linearity of a change in electrostatic capacitance between each fixed electrode and the membrane with respect to a change in pressure that acts on the membrane to be obtained over an entire pressure measuring range and that is thus able to measure pressure with high accuracy.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A pressure sensor according to a preferred embodiment of the present invention includes a base member, a membrane disposed at a distance from the base member, a first fixed electrode provided on the base member so as to be opposite to the membrane and including a dielectric layer, and a second fixed electrode provided on the base member so as to be opposite to the membrane. When pressure that acts on the membrane increases to cause the membrane to sag toward the base member, the membrane comes in contact with the dielectric layer of the first fixed electrode before a distance between the membrane and the second fixed electrode becomes constant.

This enables high linearity of a change in electrostatic capacitance between each fixed electrode and the membrane with respect to a change in pressure that acts on the membrane to be obtained over an entire pressure measuring range, and thus the pressure sensor is able to measure pressure with high accuracy.

For example, the second fixed electrode may be opposite to a central portion of the membrane, the first fixed electrode may have a ring shape surrounding the second fixed electrode when viewed in an opposing direction in which the membrane and the base member are opposite to each other, and, in the base member, a portion in which the first fixed electrode is provided may be closer to the membrane than a portion in which the second fixed electrode is provided is.

For example, the first fixed electrode may be opposite to a central portion of the membrane, the second fixed electrode may have a ring shape surrounding the first fixed electrode when viewed in an opposing direction in which the membrane and the base member are opposite to each other, and, in the base member, a portion in which the first fixed electrode is provided may be closer to the membrane than a portion in which the second fixed electrode is provided is.

For example, the second fixed electrode may be opposite to a central portion of the membrane, the first fixed electrode may have a ring shape surrounding the second fixed electrode when viewed in an opposing direction in which the membrane and the base member are opposite to each other, and the first fixed electrode and the second fixed electrode may be provided on a same plane of the base member. In this case, the pressure sensor includes a contact restriction member thicker than the first fixed electrode and the second fixed electrode.

For example, the contact restriction member may be a cylindrical member surrounding the second fixed electrode and being surrounded by the first fixed electrode when viewed in the opposing direction in which the membrane and the base member are opposite to each other.

Preferred embodiments of the present invention will be described below with reference to the drawings.

Preferred Embodiment 1

Figure 1:
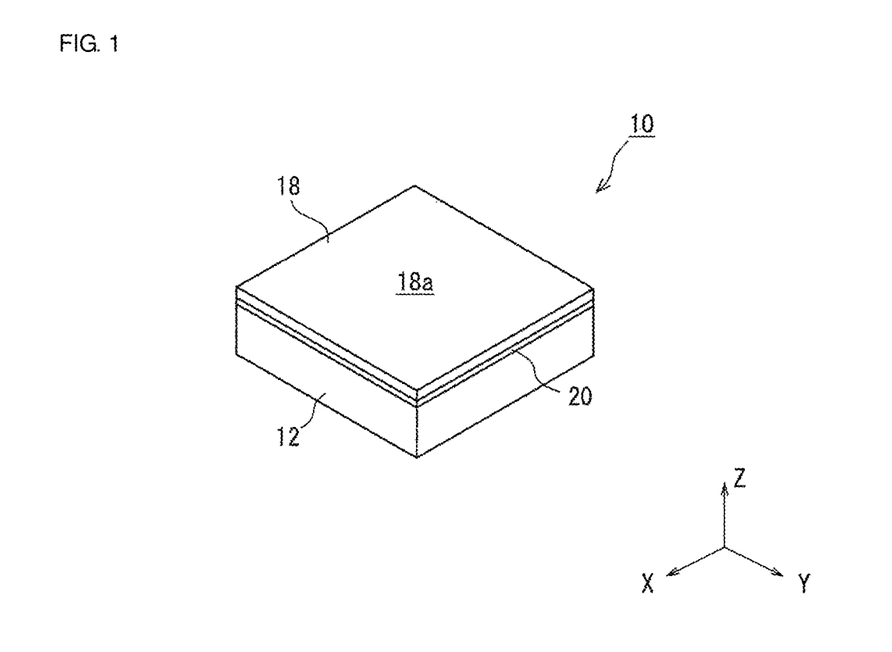
FIG. 1 is a perspective view of a pressure sensor element in a pressure sensor according to Preferred Embodiment 1 of the present invention.
Figure 2:
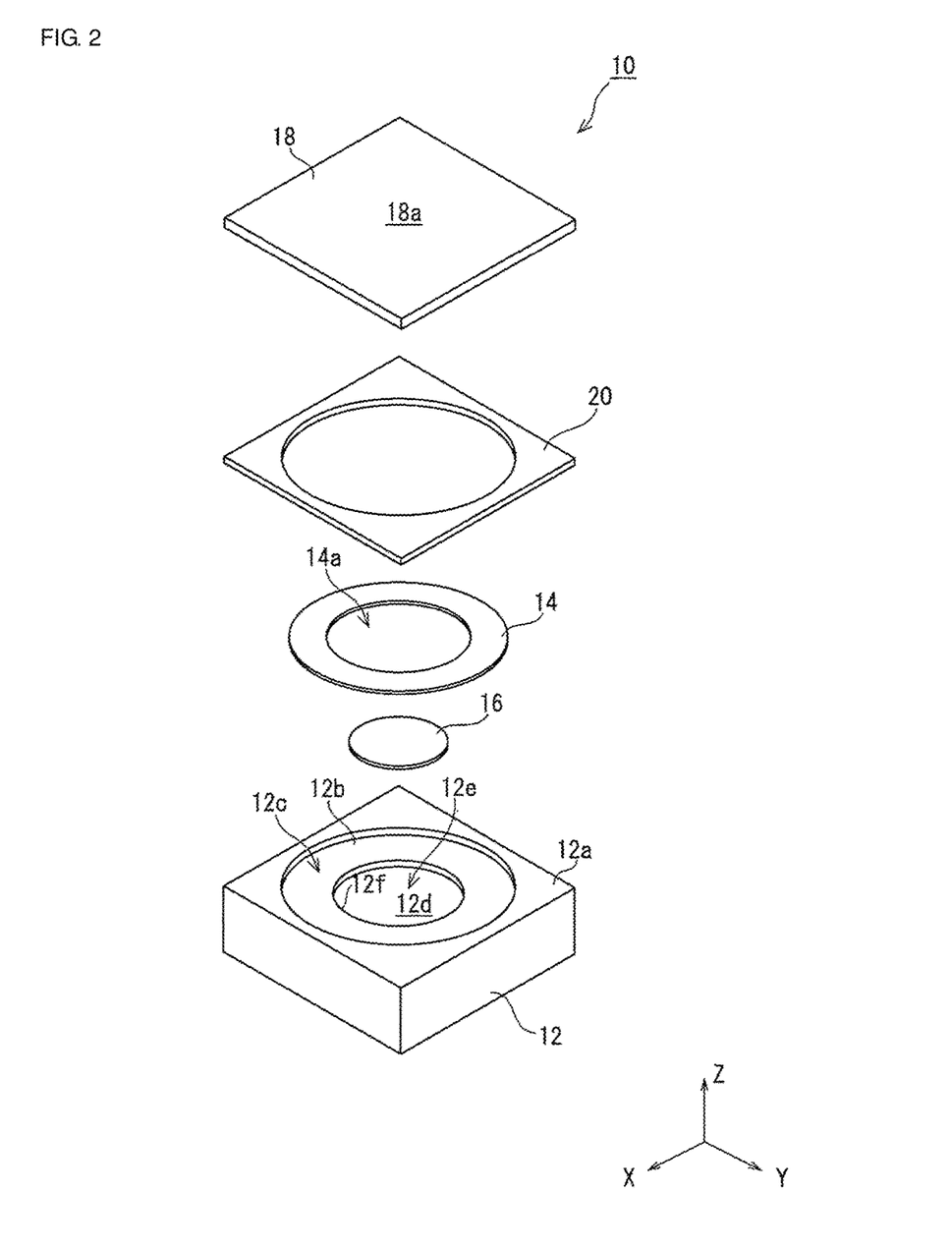
FIG. 2 is an exploded perspective view of the pressure sensor element in the pressure sensor according to Preferred Embodiment 1 of the present invention.
Figure 3:
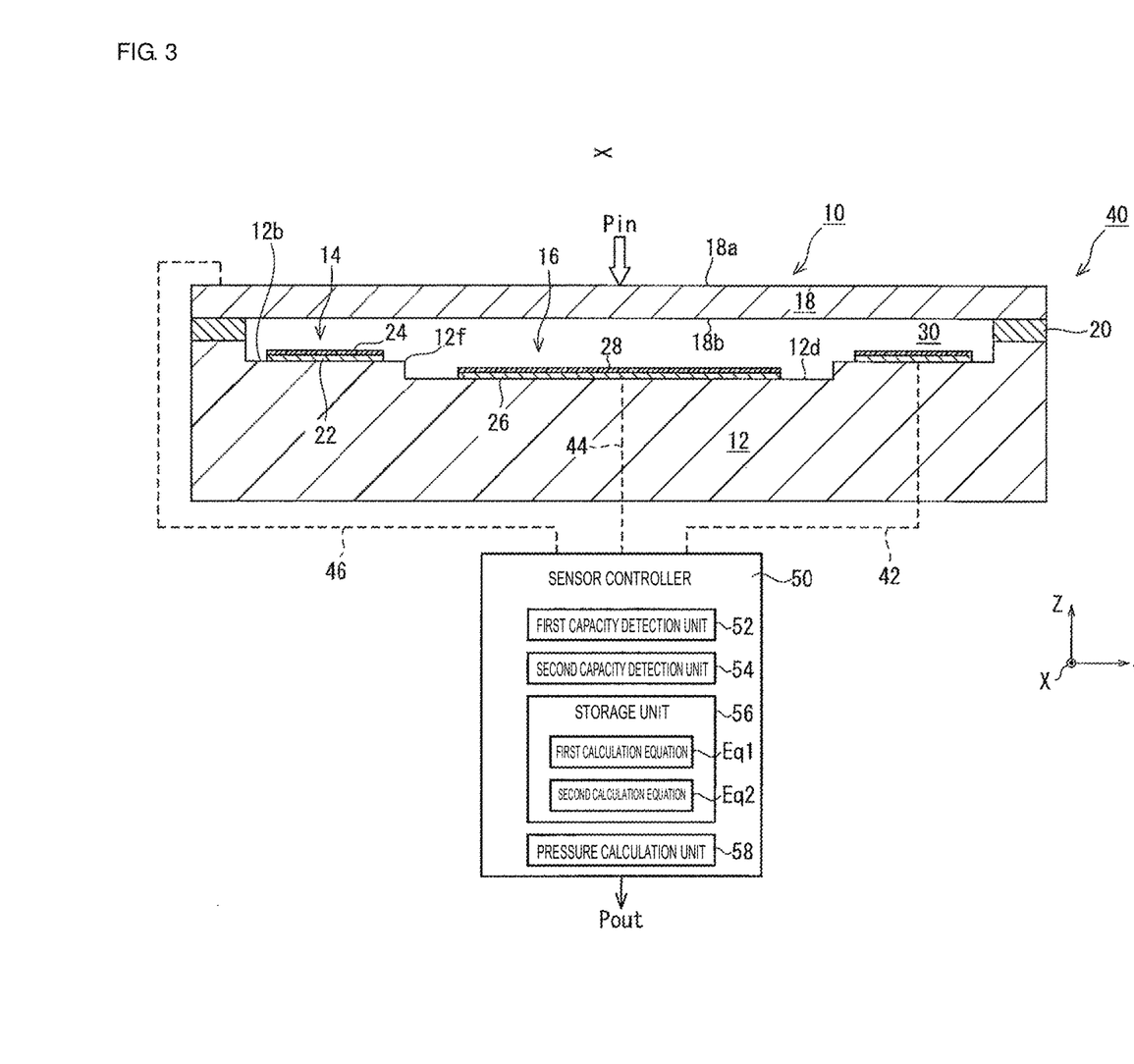
FIG. 3 schematically illustrates a configuration of the pressure sensor according to Preferred Embodiment 1 of the present invention.

FIG. 1 is a perspective view of a pressure sensor element in a pressure sensor according to Preferred Embodiment 1 of the present invention. FIG. 2 is an exploded perspective view of the pressure sensor element in the pressure sensor according to Preferred Embodiment 1. FIG. 3 schematically illustrates a configuration of the pressure sensor according to Preferred Embodiment 1. An X-Y-Z orthogonal coordinate system illustrated in each figure is intended to facilitate understanding of the present invention, but is not intended to limit the present invention.

As illustrated in FIGS. 1 and 2, a pressure sensor element 10 according to Preferred Embodiment 1 is used in a capacitive pressure sensor. The pressure sensor element 10 includes a base member 12, a first fixed electrode 14 and a second fixed electrode 16 that are provided on the base member 12, a conductive membrane 18 disposed at a distance from the base member 12, and a support member 20 that supports the membrane 18.

The base member 12 is an insulating substrate made, for example, of an insulating material.

As illustrated in FIG. 2, the first fixed electrode 14 has a ring shape including a through hole 14a and is fixed to the base member 12. Furthermore, as illustrated in FIG. 3, the first fixed electrode 14 includes a conductor 22 provided on the base member 12 and preferably made, for example, of a conductive polysilicon material, and a dielectric layer 24 opposite to the membrane 18 and provided on a surface of the conductor 22.

As illustrated in FIG. 2, the second fixed electrode 16 has a disk shape and is fixed to the base member 12. Furthermore, as illustrated in FIG. 3, the second fixed electrode 16 includes a conductor 26 provided on the base member 12 and preferably made, for example, of a conductive polysilicon material, and a dielectric layer 28 opposite to the membrane 18 and provided on a surface of the conductor 26. Furthermore, when viewed in an opposing direction in which the membrane 18 and the base member 12 are opposite to each other (when viewed in a Z-axis direction), the second fixed electrode 16 is small enough to be accommodated within the through hole 14a of the first fixed electrode 14. In other words, when viewed in the Z-axis direction, an inside diameter of the first fixed electrode 14 is larger than an outside diameter of the second fixed electrode 16.

When the membrane 18 is made, for example, of a conductive silicon material, the membrane 18 is a conductor having elasticity and conductivity. Furthermore, the membrane 18 includes a pressure receiving surface 18a to be subjected to pressure, and an electrode surface 18b located on a side opposite to the pressure receiving surface 18a and being opposite to the first and second fixed electrodes 14 and 16.

Furthermore, as illustrated in FIG. 3, an outer edge portion of the electrode surface 18b of the membrane 18 is supported by the support member 20. Thus, the membrane 18 is disposed at a distance from the base member 12. Furthermore, when pressure acts on the pressure receiving surface 18a, a portion of the membrane 18 other than the outer edge portion supported by the support member 20 sags toward the base member 12. In other words, the electrode surface 18b of the membrane 18 approaches the first and second fixed electrodes 14 and 16.

As illustrated in FIG. 2, the support member 20 is a ring-shaped or frame-shaped member made, for example, of an insulating material. As illustrated in FIG. 3, an internal space 30 that accommodates the first and second fixed electrodes 14 and 16 is defined by the base member 12, the membrane 18, and the support member 20.

Further features of the pressure sensor element 10 in the pressure sensor according to Preferred Embodiment 1 will be described.

As illustrated in FIG. 2, in a surface 12a of the base member 12 opposite to the membrane 18, a first depression 12c including a first bottom surface 12b is provided. Furthermore, in the first bottom surface 12b, a second depression 12e including a second bottom surface 12d is provided. Additionally, the first bottom surface 12b has a ring shape, and the second bottom surface 12d has a circular shape. The first bottom surface 12b and the second bottom surface 12d are provided in the base member 12 so as to be concentric with each other when viewed in the opposing direction in which the membrane 18 and the base member 12 are opposite to each other (when viewed in the Z-axis direction).

As illustrated in FIG. 3, the ring-shaped first bottom surface 12b is closer to the membrane 18 than the circular second bottom surface 12d is. Furthermore, the second bottom surface 12d is opposite to a central portion of the membrane 18, and the first bottom surface 12b is opposite to an outer periphery side portion of the membrane 18 surrounding the central portion.

On the ring-shaped first bottom surface 12b, the ring-shaped first fixed electrode 14 is provided. On the circular second bottom surface 12d, the disk-shaped second fixed electrode 16 is provided. As a result, the first fixed electrode 14 is closer to the membrane 18 than the second fixed electrode 16 is. Furthermore, the second fixed electrode 16 is opposite to the central portion of the membrane 18. The first fixed electrode 14 and the second fixed electrode 16 are provided on the base member so as to be concentric with each other when viewed in the opposing direction in which the membrane 18 and the base member 12 are opposite to each other (when viewed in the Z-axis direction). Thus, the first fixed electrode 14 surrounds the second fixed electrode 16 when viewed in the opposing direction. The reason why the first fixed electrode 14 and the second fixed electrode 16 are provided on the base member 12 in such an arrangement is described later.

As illustrated in FIG. 3, a pressure sensor 40 according to Preferred Embodiment 1 includes the pressure sensor element 10 and a sensor controller 50 connected to the pressure sensor element 10.

Specifically, the first fixed electrode 14 in the pressure sensor element 10 is connected to the sensor controller 50 via a fixed electrode line 42. Furthermore, the second fixed electrode 16 is connected to the sensor controller 50 via a fixed electrode line 44. Then, the membrane 18 is connected to the sensor controller 50 via a membrane line 46.

The sensor controller 50 is programmed and/or configured to calculate pressure that acts on the pressure receiving surface 18a of the membrane 18 in accordance with, in the pressure sensor element 10, first electrostatic capacitance C1 between the first fixed electrode 14 and the membrane 18 and second electrostatic capacitance C2 between the second fixed electrode 16 and the membrane 18 and to externally output a calculated value as an output pressure value Pout.

Specifically, the sensor controller 50 includes a first capacitance detector 52 that detects the first electrostatic capacitance C1 between the first fixed electrode 14 and the membrane 18, and a second capacitance detector 54 that detects the second electrostatic capacitance C2 between the second fixed electrode 16 and the membrane 18. Furthermore, the sensor controller 50 includes a storage 56, and a pressure calculator 58 that calculates the output pressure value Pout from the first electrostatic capacitance C1 and the second electrostatic capacitance C2 by using first and second calculation equations Eq1 and Eq2 stored in the storage 56.

Each of the first and second capacitance detectors 52 and 54 is defined by a capacitor included as a portion of a capacitive sensor or circuit that detects the first electrostatic capacitance C1 between the first fixed electrode 14 and the membrane 18 and the second electrostatic capacitance C2 between the second fixed electrode 16 and the membrane 18.

Figure 4:
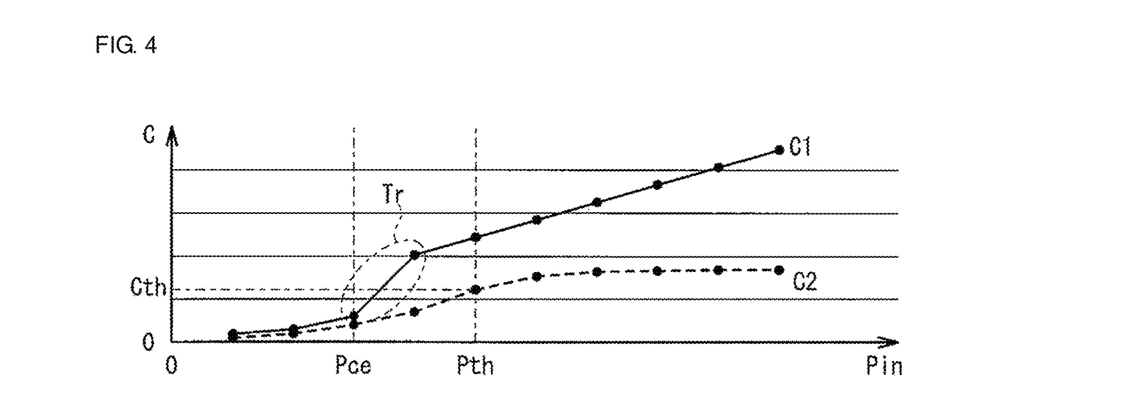
FIG. 4 illustrates pressure-capacitance characteristics of the pressure sensor according to Preferred Embodiment 1 of the present invention.

FIG. 4 illustrates pressure-capacitance characteristics of the pressure sensor according to Preferred Embodiment 1. As illustrated in FIG. 4, the first electrostatic capacitance C1 and the second electrostatic capacitance C2 respectively detected by the first capacitance detector 52 and the second capacitance detector 54 change in accordance with a change in an actual pressure value Pin that is pressure to which the pressure receiving surface 18a of the membrane 18 is subjected. In FIG. 4, a change in the first electrostatic capacitance C1 is represented by a solid line, and a change in the second electrostatic capacitance C2 is represented by a dashed line.

The storage 56 is a storage device, such as a memory, for example, and stores the first and second calculation equations Eq1 and Eq2 for calculating the output pressure value Pout from the first electrostatic capacitance C1 and the second electrostatic capacitance C2 respectively detected by the first capacitance detector 52 and the second capacitance detector 54. Each of the first and second calculation equations Eq1 and Eq2 for calculating the output pressure value Pout is a function of electrostatic capacitance based on pressure-capacitance characteristics of the pressure sensor element 10, for example, a higher-order polynomial.

The pressure calculator 58 is, for example, a processor that acquires, as electrostatic capacitance signals, the first electrostatic capacitance C1 and the second electrostatic capacitance C2 respectively detected by the first capacitance detector 52 and the second capacitance detector 54, that acquires, as calculation equation data, the first and second calculation equations Eq1 and Eq2 from the storage unit 56, and that can calculate the output pressure value Pout in accordance with the electrostatic capacitance signals and the calculation equation data. The processor calculates the output pressure value Pout, for example, by executing a program, which is stored in the storage 56, to calculate the output pressure value Pout from the first electrostatic capacitance C1 and the second electrostatic capacitance C2 respectively detected by the first capacitance detector 52 and the second capacitance detector 54 by using the first and second calculation equations Eq1 and Eq2.

Strictly speaking, the pressure calculator 58 of the sensor controller 50 does not calculate one output pressure value Pout by simultaneously using both the first electrostatic capacitance C1 detected by the first capacitance detector 52 and the second electrostatic capacitance C2 detected by the second capacitance detector 54. In other words, the pressure calculator 58 is configured to use the first electrostatic capacitance C1 or the second electrostatic capacitance C2 properly. Specifically, the output pressure value Pout is calculated from the first electrostatic capacitance C1 in a portion of a pressure measuring range of the pressure sensor 40, and the output pressure value Pout is calculated from the second electrostatic capacitance C2 in the other portion of the pressure measuring range. This will be specifically described with reference to FIG. 4.

As illustrated in FIG. 4, changes in the first electrostatic capacitance C1 and the second electrostatic capacitance C2 with respect to a change in the actual pressure value Pin are different. Such different changes are caused by the fact that positions of the first and second fixed electrodes 14 and 16 relative to the membrane 18 are different as illustrated in FIG. 3. In other words, the second fixed electrode 16 is opposite to the central portion of the membrane 18, the first fixed electrode 14 is opposite to the outer periphery side portion of the membrane 18 surrounding the central portion, and the first fixed electrode 14 is closer to the membrane 18 than the second fixed electrode 16 is, thus causing such different changes.

Specifically, as the actual pressure value Pin increases from zero, the membrane 18 sags from the central portion thereof toward the base member 12. Thus, distances between the membrane 18 and the first and second fixed electrodes 14 and 16 decrease, resulting in increases in the first electrostatic capacitance C1 and the second electrostatic capacitance C2 as illustrated in FIG. 4.

When the actual pressure value Pin increases further and reaches a predetermined pressure Pce, the membrane 18 comes in contact with the first fixed electrode 14. Around a point in time of the contact, the membrane 18 comes in contact with an opening edge 12f of the second depression 12e as illustrated in FIGS. 2 and 3.

When the membrane 18 comes in contact with the first fixed electrode 14, the first electrostatic capacitance C1 increases sharply. Then, as the actual pressure value Pin increases, the area and pressure of contact of the first fixed electrode 14 with the membrane 18 increase, and the first electrostatic capacitance C1 increases sharply with increases in the area and pressure of contact. After a transition period Tr, which is enclosed by a dash-dot-dot line, during which the membrane 18 and the first fixed electrode 14 come in contact with each other and the first electrostatic capacitance C1 increases sharply as just described, as the actual pressure value Pin increases, the first electrostatic capacitance C1 increases linearly (the first electrostatic capacitance C1 increases substantially in proportion to the actual pressure value Pin).

On the other hand, when the membrane 18 comes in contact with the first fixed electrode 14 or the opening edge 12f, the central portion of the membrane 18 is less likely to approach the second fixed electrode 16. Thus, an increase in the second electrostatic capacitance C2 with respect to an increase in the actual pressure value Pin slows down. Finally, a distance between the membrane 18 and the second fixed electrode 16 becomes substantially constant (a fixed value, not zero), and thus the second electrostatic capacitance C2 also becomes substantially constant (a fixed value). Incidentally, in the case of Preferred Embodiment 1, for example, the thickness of the membrane 18, the depth of the second depression 12e, and so forth are determined so that the membrane 18 and the second fixed electrode 16 do not come in contact with each other in the pressure measuring range of the pressure sensor 40.

As illustrated in FIG. 4, in the case of Preferred Embodiment 1, when the actual pressure value Pin increases and the membrane 18 sags toward the base member 12, before the second electrostatic capacitance C2 becomes substantially constant, that is, before the distance between the membrane 18 and the second fixed electrode 16 becomes substantially constant, the membrane 18 comes in contact with the first fixed electrode 14 at the pressure Pce. Specifically, before the distance between the membrane 18 and the second fixed electrode 16 becomes substantially constant, the transition period Tr during which the first electrostatic capacitance C1 increases sharply occurs.

In other words, in the case of Preferred Embodiment 1, there is a pressure Pth higher than pressures during the transition period Tr of the first electrostatic capacitance C1 and lower than a pressure at which the distance between the membrane 18 and the second fixed electrode 16 becomes substantially constant. The pressure calculator 58 is configured to use the first electrostatic capacitance C1 or the second electrostatic capacitance C2 properly with reference to the pressure Pth.

In a pressure range lower than the pressure Pth, the pressure calculator 58 calculates the output pressure value Pout by using the second electrostatic capacitance C2. This is because, in this pressure range, the linearity of the first electrostatic capacitance C1 is low due to the presence of the transition period Tr during which a value of the first electrostatic capacitance C1 increases sharply and the linearity of the second electrostatic capacitance C2 is higher than that of the first electrostatic capacitance C1.

In a pressure range higher than the pressure Pth, the pressure calculator 58 calculates the output pressure value Pout by using the first electrostatic capacitance C1. This is because, in this pressure range, the linearity and sensitivity of the second electrostatic capacitance C2 are low due to the presence of a pressure range in which a value of the second electrostatic capacitance C2 is substantially constant and the linearity and sensitivity of the first electrostatic capacitance C1 are higher than those of the second electrostatic capacitance C2. Incidentally, "sensitivity" herein refers to the amount of change in electrostatic capacitance per unit amount of change in the actual pressure value Pin, that is, corresponds to the inclination of an electrostatic capacitance curve illustrated in FIG. 4. As the inclination increases, "sensitivity" increases.

When the first electrostatic capacitance C1 or the second electrostatic capacitance C2 is used properly as described, over the entire pressure measuring range of the pressure sensor 40, electrostatic capacitance that changes highly linearly with a change in pressure can be used in the calculation of the output pressure value Pout. Thus, in comparison with the case where the output pressure value Pout is calculated only by using the first electrostatic capacitance C1 or only by using the second electrostatic capacitance C2, the first and second calculation equations Eq1 and Eq2 can be simplified.

More specifically, in the pressure range higher than the pressure Pth, the first calculation equation Eq1 calculates the output pressure value Pout from the first electrostatic capacitance C1 that changes highly linearly with a change in pressure. In other words, in the pressure range lower than the pressure Pth, the first calculation equation Eq1 does not calculate the output pressure value Pout from the first electrostatic capacitance C1 that changes poorly linearly with a change in pressure due to the presence of the transition period Tr. As a result, the first calculation equation Eq1 is simplified in comparison with the case where the output pressure value Pout is calculated from the first electrostatic capacitance C1 in the entire pressure measuring range.

In the pressure range lower than the pressure Pth, the second calculation equation Eq2 calculates the output pressure value Pout from the second electrostatic capacitance C2 that changes highly linearly with a change in pressure. In other words, in the pressure range higher than the pressure Pth, the second calculation equation Eq2 does not calculate the output pressure value Pout from the second electrostatic capacitance C2 that is substantially constant. As a result, the second calculation equation Eq2 is simplified in comparison with the case where the output pressure value Pout is calculated from the second electrostatic capacitance C2 in the entire pressure measuring range.

Thus, in the pressure range lower than the pressure Pth, the output pressure value Pout is calculated from the second electrostatic capacitance C2 by using the second calculation equation Eq2. Furthermore, in the pressure range higher than the pressure Pth, the output pressure value Pout is calculated from the first electrostatic capacitance C1 by using the first calculation equation Eq1. As a result, over the entire pressure measuring range of the pressure sensor 40, the output pressure value Pout is calculated from electrostatic capacitance that changes highly linearly with a change in pressure. Furthermore, since the first and second calculation equations Eq1 and Eq2 are simplified equations, accuracy of calculating the output pressure value Pout is high, that is, an error between the output pressure value Pout and the actual pressure value Pin is small. Thus, the pressure sensor 40 can measure pressure with high accuracy.

Incidentally, switching to electrostatic capacitance used in the calculation of the output pressure value Pout, that is, switching from the second electrostatic capacitance C2 to the first electrostatic capacitance C1 is performed at a point in time when the second capacitance detector 54 detects an electrostatic capacitance value Cth corresponding to the pressure Pth as illustrated in FIG. 4.

Thus, Preferred Embodiment 1 enables high linearity of a change in electrostatic capacitance between a fixed electrode and a membrane with respect to a change in pressure that acts on the membrane to be obtained over an entire pressure measuring range. As a result, a pressure sensor can measure pressure with high accuracy.

Preferred Embodiment 2

Preferred Embodiment 2 of the present invention is substantially the same as Preferred Embodiment 1 described above except that the shapes of first and second fixed electrodes and the arrangement of the first and second fixed electrodes with respect to the membrane differ from those in Preferred Embodiment 1. Thus, a description of Preferred Embodiment 2 will be provided with emphasis on the respects in which Preferred Embodiment 2 differs from Preferred Embodiment 1. Components in Preferred Embodiment 2 that are the same or substantially the same as components in Preferred Embodiment 1 described above are denoted by the same reference signs.

Figure 5:
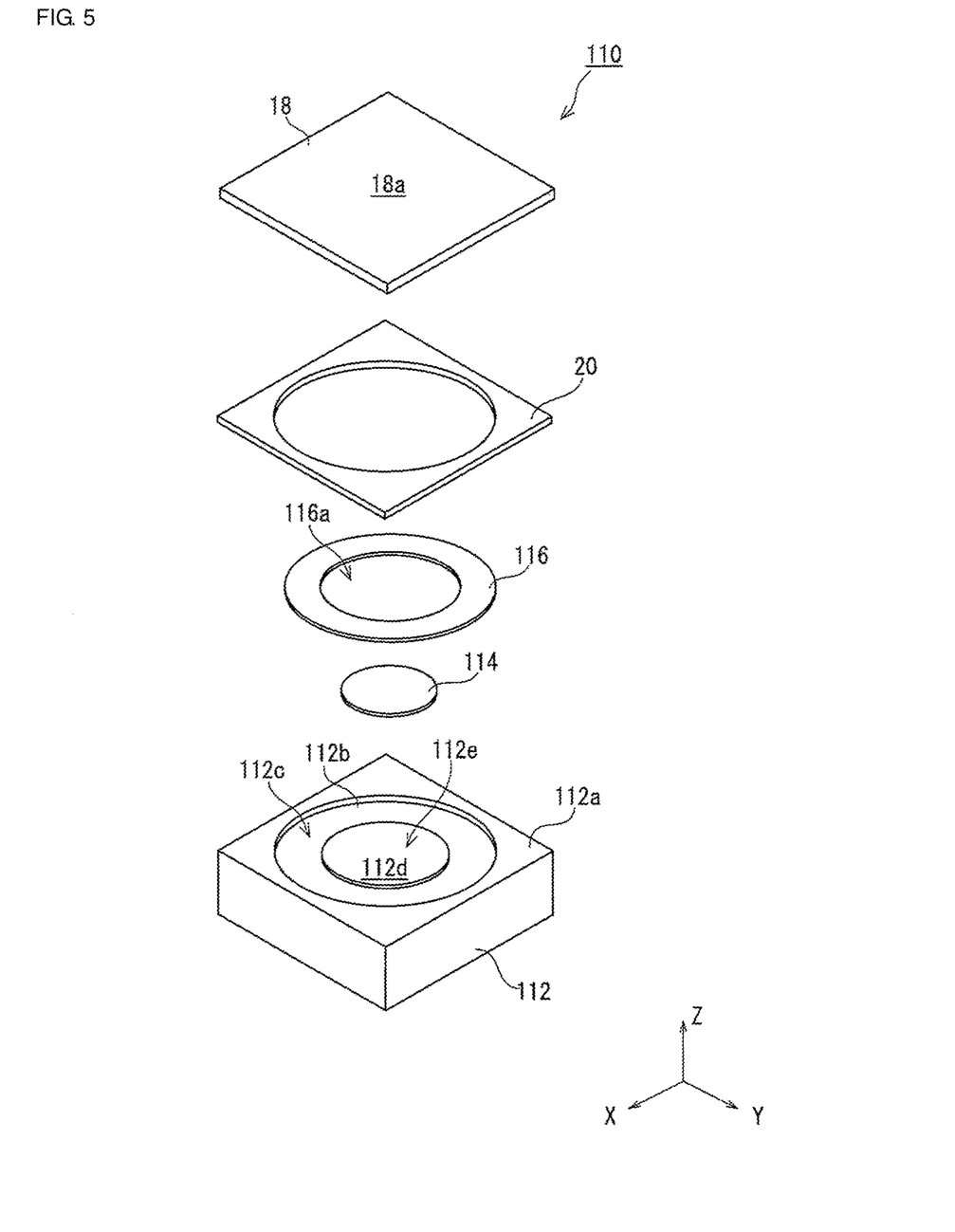
FIG. 5 is an exploded perspective view of a pressure sensor element in a pressure sensor according to Preferred Embodiment 2 of the present invention.

FIG. 5 is an exploded perspective view of a pressure sensor element in a pressure sensor according to Preferred Embodiment 2. Furthermore, FIG. 6 is a cross-sectional view of the pressure sensor element in the pressure sensor according to Preferred Embodiment 2.

As illustrated in FIG. 5, in a pressure sensor element 110 in the pressure sensor according to Preferred Embodiment 2, a first fixed electrode 114 has a disk shape, and a second fixed electrode 116 has a ring shape including a through hole 116a. When viewed in an opposing direction in which the membrane 18 and a base member 112 are opposite to each other (when viewed in the Z-axis direction), the first fixed electrode 114 is small enough to be accommodated within the through hole 116a of the second fixed electrode 116. In other words, when viewed in the Z-axis direction, an inside diameter of the second fixed electrode 116 is larger than an outside diameter of the first fixed electrode 114.

As illustrated in FIG. 5, in a surface 112a of the base member 112 opposite to the membrane 18, a depression 112c including a bottom surface 112b, and a projection 112e including a top surface 112d are provided. Furthermore, the bottom surface 112b has a ring shape, and the top surface 112d has a circular shape. The bottom surface 112b and the top surface 112d are provided in the base member 112 so as to be concentric with each other when viewed in the opposing direction in which the membrane 18 and the base member 112 are opposite to each other (when viewed in the Z-axis direction).

Figure 6:
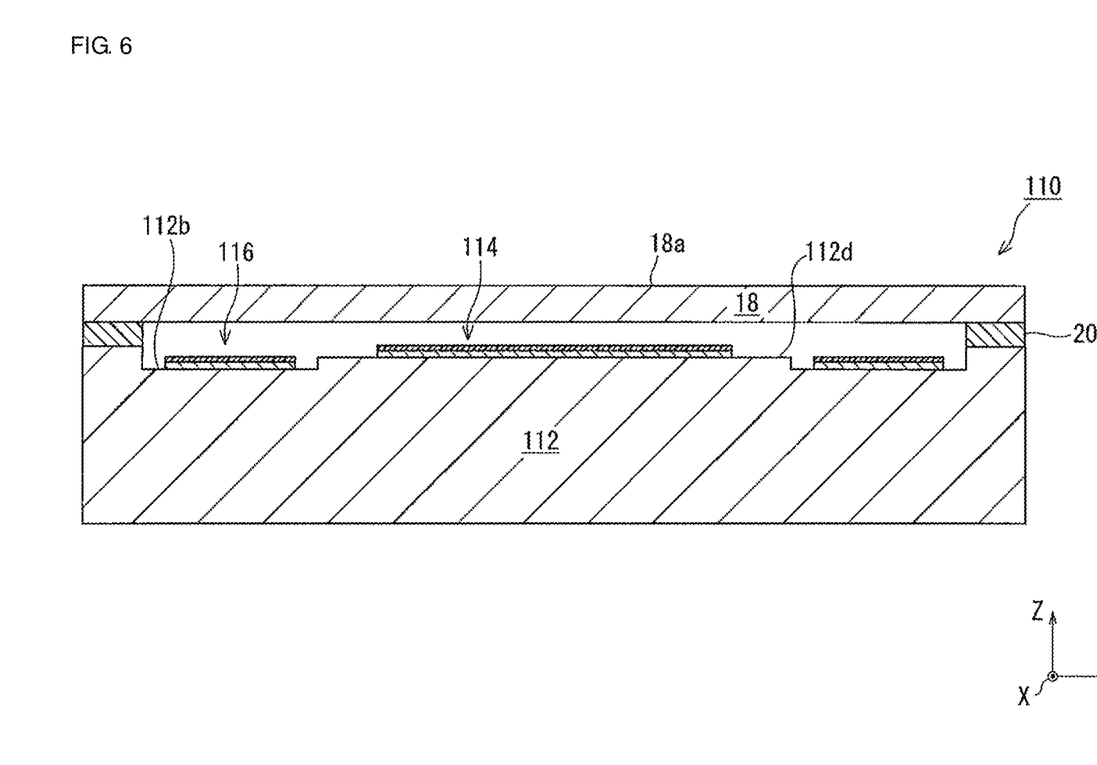
FIG. 6 is a cross-sectional view of the pressure sensor element in the pressure sensor according to Preferred Embodiment 2 of the present invention.

As illustrated in FIG. 6, the circular top surface 112d is closer to the membrane 18 than the ring-shaped bottom surface 112b is. Furthermore, the top surface 112d is opposite to the central portion of the membrane 18, and the bottom surface 112b is opposite to the outer periphery side portion of the membrane 18 surrounding the central portion.

On the ring-shaped bottom surface 112b, the ring-shaped second fixed electrode 116 is provided. On the circular top surface 112d, the disk-shaped first fixed electrode 114 is provided. As a result, the first fixed electrode 114 is closer to the membrane 18 than the second fixed electrode 116 is. Furthermore, the first fixed electrode 114 is opposite to the central portion of the membrane 18. The first fixed electrode 114 and the second fixed electrode 116 are provided on the base member 112 so as to be concentric with each other when viewed in the opposing direction in which the membrane 18 and the base member 112 are opposite to each other (when viewed in the Z-axis direction). Thus, the second fixed electrode 116 surrounds the first fixed electrode 114 when viewed in the opposing direction (when viewed in the Z-axis direction).

Figure 7:
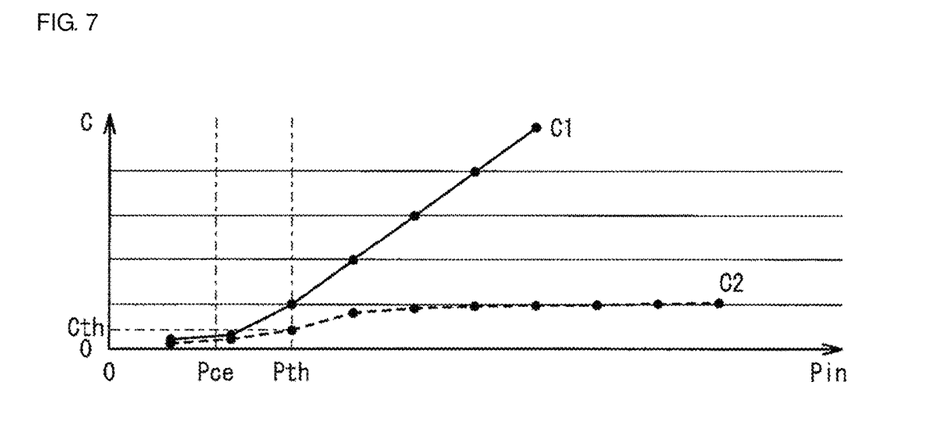
FIG. 7 illustrates pressure-capacitance characteristics of the pressure sensor according to Preferred Embodiment 2 of the present invention.

FIG. 7 illustrates pressure-capacitance characteristics of the pressure sensor according to Preferred Embodiment 2.

As illustrated in FIG. 7, the first fixed electrode 114 and the membrane 18 come in contact with each other at the pressure Pce before a distance between the second fixed electrode 116 and the membrane 18 becomes substantially constant, that is, before the second electrostatic capacitance C2 becomes substantially constant. In the case of Preferred Embodiment 2, for example, the thickness of the membrane 18, the depth of the depression 112c, and so forth are determined so that the membrane 18 and the second fixed electrode 116 do not come in contact with each other in a pressure measuring range of the pressure sensor.

A pressure calculator of a sensor controller in the pressure sensor according to Preferred Embodiment 2 is configured to use the first electrostatic capacitance C1 or the second electrostatic capacitance C2 properly with reference to the pressure Pth that is higher than the pressure Pce and is present before the second electrostatic capacitance C2 becomes substantially constant.

In a pressure range higher than the pressure Pth, the linearity of the first electrostatic capacitance C1 between the first fixed electrode 114 and the membrane 18 is higher than that of the second electrostatic capacitance C2. Thus, in this pressure range, an output pressure value is calculated by using the first electrostatic capacitance C1.

In a pressure range lower than the pressure Pth, the linearity of the second electrostatic capacitance C2 between the second fixed electrode 116 and the membrane 18 is higher than that of the first electrostatic capacitance C1. Thus, in this pressure range, the output pressure value is calculated by using the second electrostatic capacitance C2.

Thus, as in Preferred Embodiment 1 described above, Preferred Embodiment 2 also enables high linearity of a change in electrostatic capacitance between a fixed electrode and a membrane with respect to a change in pressure that acts on the membrane to be obtained over an entire pressure measuring range. As a result, a pressure sensor can measure pressure with high accuracy.

Preferred Embodiment 3

Preferred Embodiment 3 of the present invention is substantially the same as Preferred Embodiment 1 described above except that the arrangement of first and second fixed electrodes with respect to the membrane differs from that in Preferred Embodiment 1. Thus, a description of Preferred Embodiment 3 will be provided with emphasis on the respect in which Preferred Embodiment 3 differs from Preferred Embodiment 1. Components in Preferred Embodiment 3 that are the same or substantially the same as components in Preferred Embodiment 1 described above are denoted by the same reference signs.

Figure 8:
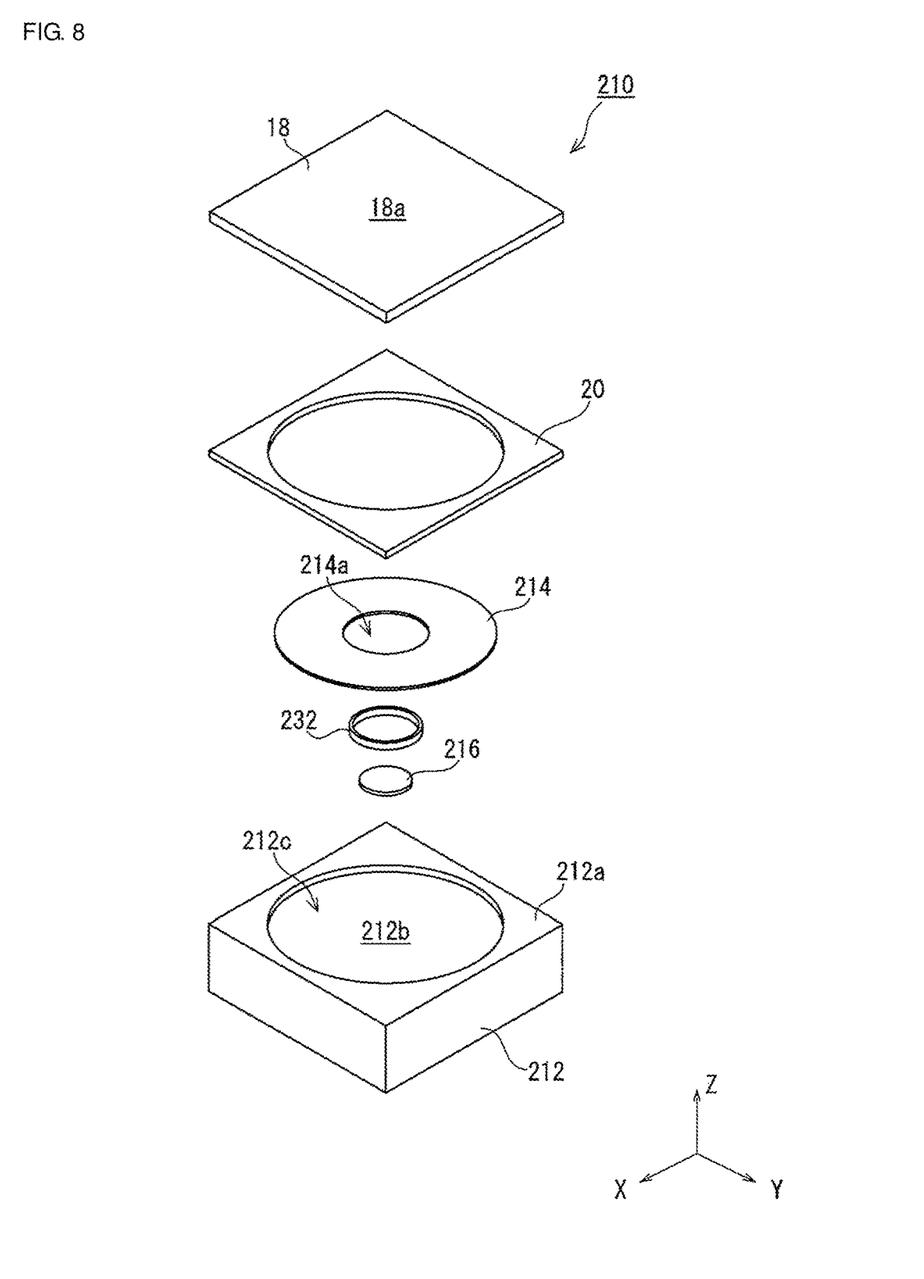
FIG. 8 is an exploded perspective view of a pressure sensor element in a pressure sensor according to Preferred Embodiment 3 of the present invention.

FIG. 8 is an exploded perspective view of a pressure sensor element in a pressure sensor according to Preferred Embodiment 3. Furthermore, FIG. 9 is a cross-sectional view of the pressure sensor element in the pressure sensor according to Preferred Embodiment 3.

As illustrated in FIG. 8, in a pressure sensor element 210 in the pressure sensor according to Preferred Embodiment 3, a first fixed electrode 214 has a ring shape including a through hole 214a, and a second fixed electrode 216 has a disk shape. When viewed in an opposing direction in which the membrane 18 and a base member 212 are opposite to each other (when viewed in the Z-axis direction), the second fixed electrode 216 is small enough to be accommodated within the through hole 214a of the first fixed electrode 214. In other words, when viewed in the Z-axis direction, an inside diameter of the first fixed electrode 214 is larger than an outside diameter of the second fixed electrode 216.

As illustrated in FIG. 8, in a surface 212a of the base member 212 opposite to the membrane 18, a depression 212c including a bottom surface 212b is provided. Furthermore, the bottom surface 212b has a circular shape.

Figure 9:
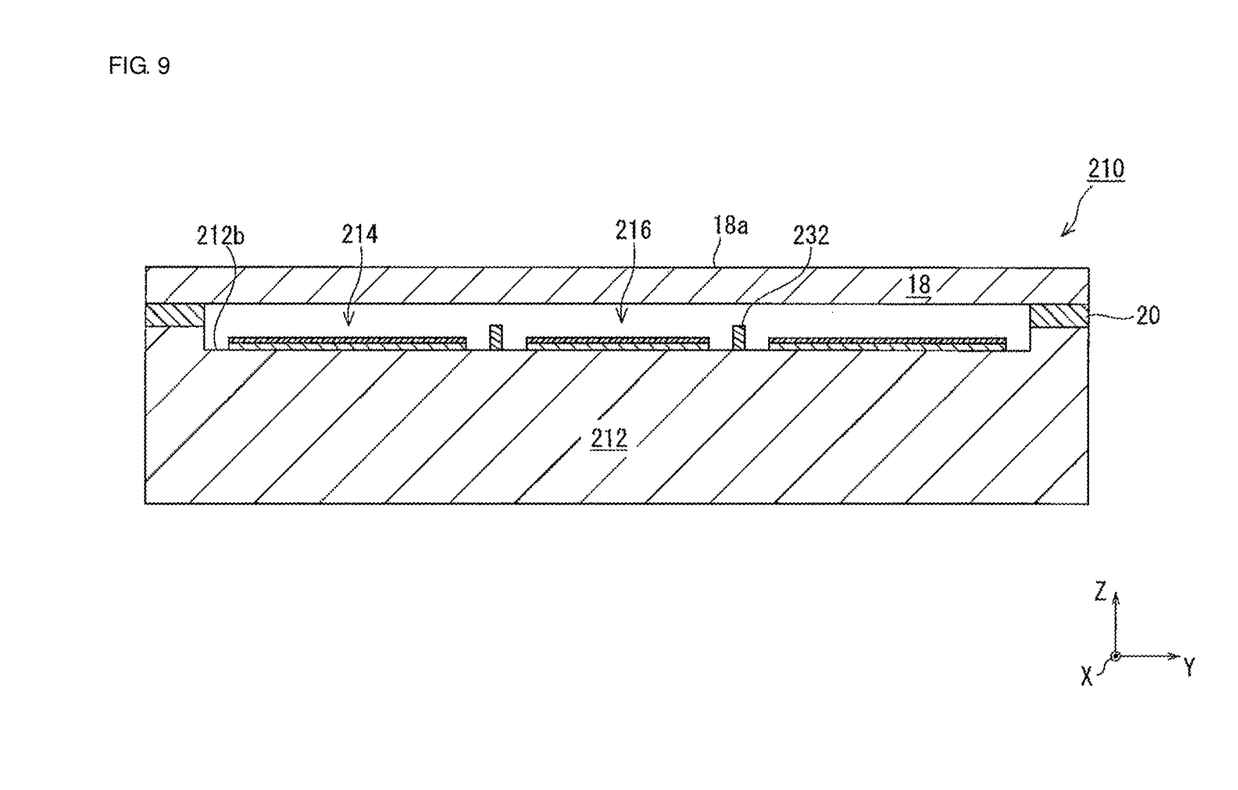
FIG. 9 is a cross-sectional view of the pressure sensor element in the pressure sensor according to Preferred Embodiment 3 of the present invention.

As illustrated in FIG. 9, on the circular bottom surface 212b, the ring-shaped first fixed electrode 214 and the disk-shaped second fixed electrode 216 are provided. In other words, these are provided on the same plane. Furthermore, the second fixed electrode 216 is opposite to the central portion of the membrane 18. The first fixed electrode 214 and the second fixed electrode 216 are provided on the base member 212 so as to be concentric with each other when viewed in the opposing direction in which the membrane 18 and the base member 212 are opposite to each other (when viewed in the Z-axis direction). Thus, the first fixed electrode 214 surrounds the second fixed electrode 216 when viewed in the opposing direction.

As illustrated in FIG. 9, the first fixed electrode 214 and the second fixed electrode 216 are provided on the bottom surface 212b, that is, on the same plane, and the second fixed electrode 216 is opposite to the central portion of the membrane 18. For this reason, when the membrane 18 sags under pressure, the membrane 18 approaches the second fixed electrode 216 rather than the first fixed electrode 214.

In the pressure sensor element 210, a contact restriction member 232 thicker than the first fixed electrode 214 and the second fixed electrode 216 is provided. The contact restriction member 232 restricts contact between the membrane 18 and the second fixed electrode 216 by coming in contact with the membrane 18.

In the case of Preferred Embodiment 3, the contact restriction member 232 is a cylindrical member as illustrated in FIG. 8 and is provided on the circular bottom surface 212b of the base member 212 so as to be located between the first fixed electrode 214 and the second fixed electrode 216 as illustrated in FIG. 9. In other words, the contact restriction member 232 surrounds the second fixed electrode 216 and is surrounded by the first fixed electrode 214 when viewed in the opposing direction in which the membrane 18 and the base member 212 are opposite to each other (when viewed in the Z-axis direction).

The contact restriction member 232 is not limited to the cylindrical member. For example, at least three or more columnar members equally spaced along an outer periphery of the second fixed electrode 216 may be used.

Figure 10:
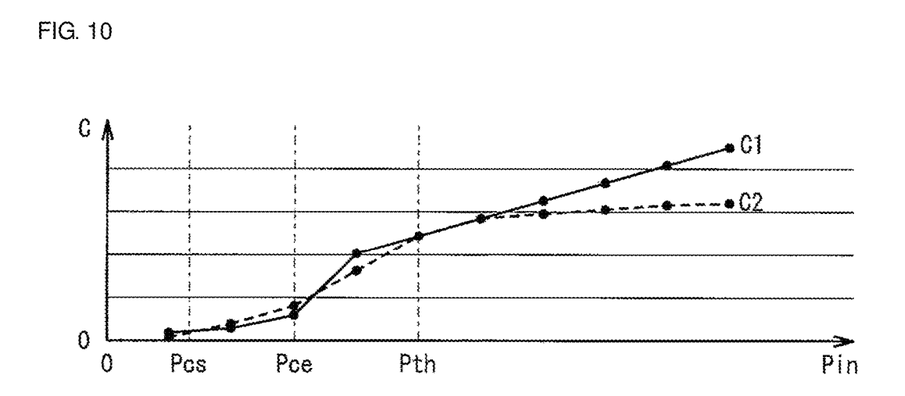
FIG. 10 illustrates pressure-capacitance characteristics of the pressure sensor according to Preferred Embodiment 3 of the present invention.

FIG. 10 illustrates pressure-capacity characteristics of the pressure sensor according to Preferred Embodiment 3.

As illustrated in FIG. 10, the first fixed electrode 214 and the membrane 18 come in contact with each other at the pressure Pce before a distance between the second fixed electrode 216 and the membrane 18 becomes substantially constant, that is, before the second electrostatic capacitance C2 becomes substantially constant. The membrane 18 comes in contact with the contact restriction member 232 at a pressure Pcs lower than the pressure Pce. Thus, in a pressure measuring range of the pressure sensor, contact between the membrane 18 and the second fixed electrode 216 is restricted.

A pressure calculator of a sensor controller in the pressure sensor according to Preferred Embodiment 3 is configured to use the first electrostatic capacitance C1 or the second electrostatic capacitance C2 properly with reference to the pressure Pth that is higher than the pressure Pce and is present before the second electrostatic capacitance C2 becomes substantially constant.

In a pressure range higher than the pressure Pth, the linearity of the first electrostatic capacitance C1 between the first fixed electrode 214 and the membrane 18 is higher than that of the second electrostatic capacitance C2. Thus, in this pressure range, an output pressure value is calculated by using the first electrostatic capacitance C1.

In a pressure range lower than the pressure Pth, the linearity of the second electrostatic capacitance C2 between the second fixed electrode 216 and the membrane 18 is higher than that of the first electrostatic capacitance C1. Thus, in this pressure range, the output pressure value is calculated by using the second electrostatic capacitance C2.

Thus, as in Preferred Embodiment 1 described above, Preferred Embodiment 3 also enables high linearity of a change in electrostatic capacitance between a fixed electrode and a membrane with respect to a change in pressure that acts on the membrane to be obtained over an entire pressure measuring range. As a result, a pressure sensor can measure pressure with high accuracy.

Although the present invention has been described above by using the above-described preferred embodiments, preferred embodiments of the present invention are not limited to these.

For example, in the case of Preferred Embodiment 1 described above, as illustrated in FIG. 3, the second fixed electrode 16 that does not come in contact with the membrane 18 in the pressure measuring range of the pressure sensor 40 includes the dielectric layer 28 opposite to the membrane 18. If pressure in a measurement environment is stable in the pressure measuring range of the pressure sensor 40, that is, if there is practically no possibility of contact between the membrane 18 and the second fixed electrode 16 at a pressure in the pressure measuring range, the second fixed electrode 16 may include only the conductor 26 without the dielectric layer 28.

That is, a pressure sensor according to a preferred embodiment of the present invention is, in a broad sense, a pressure sensor including a base member, a membrane disposed at a distance from the base member, a first fixed electrode provided on the base member so as to be opposite to the membrane and including a dielectric layer, and a second fixed electrode provided on the base member so as to be opposite to the membrane. When pressure that acts on the membrane increases to cause the membrane to sag toward the base member, the membrane comes in contact with the dielectric layer of the first fixed electrode before a distance between the membrane and the second fixed electrode becomes constant.

Although the present invention has been described above with reference to preferred embodiments, a preferred embodiment obtained by combining at least one preferred embodiment wholly or partially with a preferred embodiment can be regarded as a further preferred embodiment according to the present invention.

Preferred embodiments of the present invention are applicable to a capacitive pressure sensor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A pressure sensor comprising:
a base;
a membrane disposed at a distance from the base;
a first fixed electrode provided on the base so as to be opposite to the membrane and including a dielectric layer; and
a second fixed electrode provided on the base so as to be opposite to the membrane; wherein
when pressure that acts on the membrane increases to cause the membrane to sag toward the base, the membrane comes in contact with the dielectric layer of the first fixed electrode before a distance between the membrane and the second fixed electrode becomes constant;
the second fixed electrode is opposite to a central portion of the membrane;
the first fixed electrode has a ring shape surrounding the second fixed electrode when viewed in an opposing direction in which the membrane and the base are opposite to each other; and
in the base, a portion in which the first fixed electrode is provided is closer to the membrane than a portion in which the second fixed electrode is provided.

2. The pressure sensor according to claim 1, wherein the base is made of an insulating material.

3. The pressure sensor according to claim 1, wherein the first fixed electrode includes a conductor layer on the dielectric layer.

4. The pressure sensor according to claim 3, wherein the conductor layer is made of a conductive polysilicon material.

5. The pressure sensor according to claim 1, wherein the second fixed electrode has a disk shape.

6. The pressure sensor according to claim 1, wherein the membrane is made of conductive silicon material.

7. The pressure sensor according to claim 1, wherein the base includes a ring-shaped first bottom surface on which the first fixed electrode is provided, and a circular second bottom surface on which the second fixed electrode is provided.

8. A pressure sensor comprising:
a base;
a membrane disposed at a distance from the base;
a first fixed electrode provided on the base so as to be opposite to the membrane and including a dielectric layer; and
a second fixed electrode provided on the base so as to be opposite to the membrane; wherein
when pressure that acts on the membrane increases to cause the membrane to sag toward the base, the membrane comes in contact with the dielectric layer of the first fixed electrode before a distance between the membrane and the second fixed electrode becomes constant;
the first fixed electrode is opposite to a central portion of the membrane;
the second fixed electrode has a ring shape surrounding the first fixed electrode when viewed in an opposing direction in which the membrane and the base are opposite to each other; and
in the base, a portion in which the first fixed electrode is provided is closer to the membrane than a portion in which the second fixed electrode is provided.

9. The pressure sensor according to claim 8, wherein the first fixed electrode has a disk shape.

10. The pressure sensor according to claim 8, the base includes a circular first bottom surface on which the first fixed electrode is provided, and a ring shaped second bottom surface on which the second fixed electrode is provided.

11. The pressure sensor according to claim 8, wherein the base is made of an insulating material.

12. The pressure sensor according to claim 8, wherein the first fixed electrode includes a conductor layer on the dielectric layer.

13. The pressure sensor according to claim 8, wherein the membrane is made of conductive silicon material.

14. A pressure sensor comprising:
a base;
a membrane disposed at a distance from the base;
a first fixed electrode provided on the base so as to be opposite to the membrane and including a dielectric layer; and
a second fixed electrode provided on the base so as to be opposite to the membrane; wherein
when pressure that acts on the membrane increases to cause the membrane to sag toward the base, the membrane comes in contact with the dielectric layer of the first fixed electrode before a distance between the membrane and the second fixed electrode becomes constant;
the second fixed electrode is opposite to a central portion of the membrane;
the first fixed electrode has a ring shape surrounding the second fixed electrode when viewed in an opposing direction in which the membrane and the base are opposite to each other;
the first fixed electrode and the second fixed electrode are provided on a same plane of the base; and
the pressure sensor comprises a contact restriction member thicker than the first fixed electrode and the second fixed electrode.

15. The pressure sensor according to claim 14, wherein the contact restriction member is a cylindrical member surrounding the second fixed electrode and being surrounded by the first fixed electrode when viewed in the opposing direction in which the membrane and the base are opposite to each other.

16. The pressure sensor according to claim 14, wherein the second fixed electrode has a disk shape.

17. The pressure sensor according to claim 14, wherein the base includes a circular bottom surface on which the first and second fixed electrodes are provided.

18. The pressure sensor according to claim 14, wherein the base is made of an insulating material.

19. The pressure sensor according to claim 14, wherein the first fixed electrode includes a conductor layer on the dielectric layer.

20. The pressure sensor according to claim 14, wherein the membrane is made of conductive silicon material.

* * * * *